(12) United States Patent
Pasotti et al.

(10) Patent No.: US 9,893,689 B2
(45) Date of Patent: Feb. 13, 2018

(54) SYSTEM AND METHOD FOR A MULTISTAGE OPERATIONAL AMPLIFIER

(71) Applicant: STMicroelectronics S.r.l., Agrate Brianza (IT)

(72) Inventors: Marco Pasotti, Travaco' Siccomario (IT); Riccardo Zurla, Binasco (IT); Alessandro Cabrini, San Genesio ed Uniti (IT); Guido Torelli, Sant'Alessio con Vialone (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 15/192,863

(22) Filed: Jun. 24, 2016

(65) Prior Publication Data

US 2017/0373654 A1 Dec. 28, 2017

(51) Int. Cl.
| | |
|---|---|
| *H03F 3/45* | (2006.01) |
| *H03F 1/14* | (2006.01) |
| *H03F 1/08* | (2006.01) |

(52) U.S. Cl.
CPC ....... *H03F 3/45273* (2013.01); *H03F 3/4521* (2013.01); *H03F 1/083* (2013.01); *H03F 1/14* (2013.01); *H03F 3/45* (2013.01); *H03F 3/45174* (2013.01); *H03F 2200/375* (2013.01); *H03F 2203/45222* (2013.01)

(58) Field of Classification Search
CPC ...... H03F 3/45273; H03F 3/4521; H03F 1/34; H03F 1/36; H03F 1/38; H03F 3/68; H03F 1/083; H03F 1/086; H03F 1/14; H03F 3/19; H03F 2200/451; H03B 5/1221

USPC ......... 330/85, 107, 109, 257, 291, 292, 294, 330/301, 310

See application file for complete search history.

(56) References Cited

U.S. PATENT DOCUMENTS

| | | | |
|---|---|---|---|
| 4,291,276 A * | 9/1981 | Ida ........................... | H04R 3/04 330/85 |
| 5,204,639 A | 4/1993 | Moore et al. | |
| 5,389,894 A | 2/1995 | Ryat | |
| 5,410,273 A | 4/1995 | Brehmer et al. | |
| 5,854,573 A * | 12/1998 | Chan ................... | H03F 3/45475 330/292 |

(Continued)

FOREIGN PATENT DOCUMENTS

| | | |
|---|---|---|
| CN | 101388650 A | 3/2009 |
| JP | 8148944 A | 6/1996 |

OTHER PUBLICATIONS

Ahuja, B., "An Improved Frequency Compensation Technique for CMOS Operational Amplifiers," IEEE Journal of Solid-State Circuits, vol. SC-18, No. 6, Dec. 1983, 629-633 pages.

(Continued)

*Primary Examiner* — Khanh V Nguyen
(74) *Attorney, Agent, or Firm* — Slater Matsil, LLP

(57) ABSTRACT

According to an embodiment, an operational amplifier includes a first amplifier stage coupled between an input node and an intermediate node, a second amplifier stage coupled between the intermediate node and an output node, a compensation capacitor having a first terminal coupled to the intermediate node and a second terminal, and a compensation amplifier coupled between the output node and the second terminal. The compensation amplifier has a positive gain greater than one.

30 Claims, 7 Drawing Sheets

(56) References Cited

U.S. PATENT DOCUMENTS

| | | | |
|---|---|---|---|
| 6,016,272 | A | 1/2000 | Gema et al. |
| 6,128,228 | A | 10/2000 | Pasotti et al. |
| 6,340,918 | B2 | 1/2002 | Taylor |
| 6,788,146 | B2 | 9/2004 | Forejt et al. |
| 7,403,067 | B1* | 7/2008 | Aram .................. H03F 3/68 330/85 |
| 7,724,080 | B2* | 5/2010 | Luff ................... H03F 3/393 327/124 |
| 7,986,185 | B2* | 7/2011 | Huang ................. H03F 1/14 330/292 |
| 8,619,469 | B2 | 12/2013 | Pasotti et al. |
| 2006/0055456 | A1 | 3/2006 | Niederkom |
| 2011/0157972 | A1 | 6/2011 | Pasotti et al. |

OTHER PUBLICATIONS

Castello, R., "CMOS Buffer Amplifiers," Analog Circuit Design, Oct. 4, 2013, 113-138 pages.

Gray, P., et al., "MOS Operational Amplifier Design—A Tutorial Overview," IEEE Journal of Solid-State Circuits, vol. SC-17, No. 6, Dec. 1982, 969-982 pages.

Palmisano, G., et al., "Design Procedure for Two-Stage CMOS Transconductance Operational Amplifiers: A Tutorial," Analog Integrated Circuits and Signal Processing, vol. 27, No. 3, May 2001, 179-189.

Senderowicz, D., et al., "High-Performance NMOS Operational Amplifier," IEEE Journal of Solid-State Circuits, vol. SC-13, No. 6, Dec. 1978, 760-766 pages.

Solomon, J., "The Monolithic Op Amp: A Tutorial Study," IEEE Journal of Solid-State Circuits, vol. SC-9, No. 6, Dec. 1974, 314-332 pages.

Tsividis, Y., et al., "An Integrated NMOS Operational Amplifier with Internal Compensation," IEEE Journal of Solid-State Circuits, vol. 11, Issue 6, Dec. 1976, 748-753 pages.

Yan, Z., et al., "Two-Stage Operational Amplifiers: Power-and-Area-Efficient Frequency Compensation for Driving a Wide Range of Capacitive Load," IEEE Circuits and Systems Magazine, vol. 11, Issue 1, Feb. 18, 2011, 26-42 pages.

* cited by examiner

SYSTEM AND METHOD FOR A MULTISTAGE OPERATIONAL AMPLIFIER

TECHNICAL FIELD

The present invention relates generally to analog circuits, and, in particular embodiments, to a system and method for a multistage operational amplifier.

BACKGROUND

An amplifier is an electronic device that can increase the power of a signal by taking energy from a power supply and controlling the output to match the input signal shape, while increasing the amplitude. Amplifiers are used in multiple aspects of electronic circuits and particularly in analog circuits. A specific type of amplifier is the operational amplifier (op-amp). Op-amps are used in consumer, industrial, and scientific devices, for example. Op-amps may be packaged as components, or used as elements of more complex integrated circuits (ICs). Op-amps may be implemented using numerous circuit fabrication techniques and are often fabricated as a CMOS IC. Op-amps are generally implemented using one or more stages with or without a compensating network. The numerous configurations and implementations of various op-amps are often related to the particular implementation and intended usage.

One of the main constraints for an uncompensated two-stage CMOS op-amp is an inherently small frequency spacing between a first and a second pole, which causes insufficient phase margin and leads to instability in closed-loop conditions. Different frequency compensation techniques are used in order to overcome this limit. The most popular technique is Miller compensation, which achieves pole splitting by using a compensation capacitor placed around a second stage of the op-amp. For Miller compensation, the dominant pole may be shifted to a lower frequency due to the increased effective capacitance at the output node of the first stage, whereas the non-dominant pole is pushed to a higher frequency as a result of the reduced output impedance of the second stage at sufficiently high frequencies. Miller compensation does generally produce a right half-plane (RHP) zero, which is caused by a feed-forward path introduced by the compensation capacitor. The frequency of this zero may be on the same order of magnitude of the unity-gain frequency of the op-amp since the transconductances of the two stages are generally similar in CMOS technology, which significantly degrades the phase margin of the op-amp and reduces stability.

There are different techniques used with Miller compensation for addressing the RHP zero. The different techniques include nulling-resistor compensation (NRC), voltage-buffer compensation (VBC), and current-buffer compensation (CBC). Nulling-resistor compensation uses a resistor connected in series with the compensation capacitor, which moves the zero to a new frequency. If a proper value of the resistor is chosen, the zero approaches infinity and, hence, reduces instability problems. Both current-buffer and voltage-buffer compensations (CBC and VBC), rather than relocating the RHP zero, prevent the formation of the RHP zero by cutting the feed-forward path originated by the compensation capacitor.

For example, voltage-buffer compensation includes placing a unity-gain buffer between the output of the second stage and the right plate of the compensation capacitor, so that the signal voltage across the compensation capacitor is the same as in the case of standard Miller compensation. As another example, current-buffer compensation includes placing a unity-gain current-buffer between the left plate of the compensation capacitor, as depicted in a conventional circuit schematic, and the output of the first stage, so that the signal current injected into the latter node is the same as in standard Miller compensation. In some cases, current-buffer compensation allows obtaining a larger gain-bandwidth product; however, current-buffer compensation design is not as straightforward as voltage-buffer compensation due to the non-zero input impedance of the current-buffer, which can cause the formation of complex and conjugates poles that may lead to instability.

SUMMARY

According to an embodiment, an operational amplifier includes a first amplifier stage coupled between an input node and an intermediate node, a second amplifier stage coupled between the intermediate node and an output node, a compensation capacitor having a first terminal coupled to the intermediate node and a second terminal, and a compensation amplifier coupled between the output node and the second terminal. The compensation amplifier has a positive gain greater than one.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely amplifiers, and more particularly, operational amplifiers (op-amps). Some of the various embodiments described herein include multistage op-amps, compensation for op-amps, voltage-buffer compensation for multistage op-amps, and positive gain amplifiers used in voltage compensation for multistage op-amps. In other embodiments, aspects may also be applied to other applications involving any type of amplifier or compensation feedback circuit according to any fashion as known in the art.

According to various embodiments, voltage-buffer compensation for multistage op-amps is enhanced by introducing a gain stage in the feedback compensation path. In various embodiments, a feedback path around a stage of a multistage op-amp to an intermediate node is provided through a series path including a positive gain amplifier coupled to a compensation capacitor. In some embodiments, the positive gain amplifier is introduced in place of a standard unity gain buffer for standard voltage-buffer compensation. According to various embodiments, the positive gain stage allows the use of a smaller compensation capacitor (by increasing the effective capacitance) and moves the non-dominant pole toward higher frequencies with respect to conventional voltage-buffer compensation, thus ensuring a higher gain-bandwidth product of embodiment op-amps.

Figure 1A:
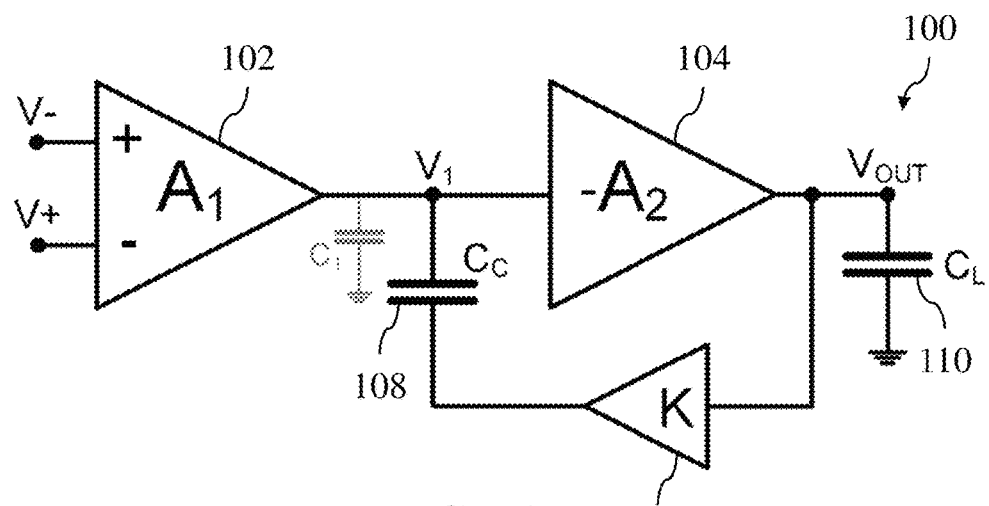
FIGS. 1A and 1B illustrate a block diagram and a circuit schematic of an embodiment operational amplifier.
Figure 1B:
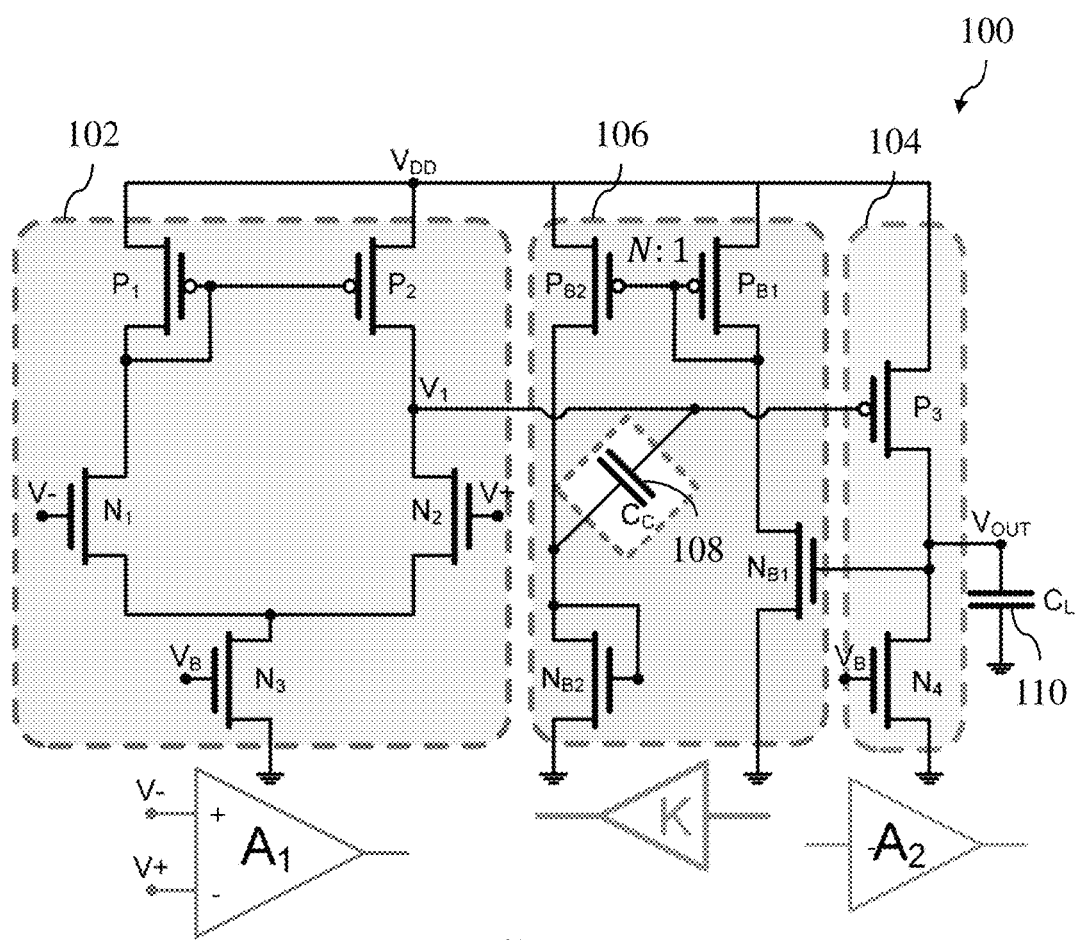

FIGS. 1A and 1B illustrate a block diagram and a circuit schematic of an embodiment operational amplifier (op-amp) 100 including differential input stage 102, negative gain stage 104, positive gain compensation stage 106, compensation capacitor 108 (having a capacitance CC), and load capacitance 110 (having a capacitance CL). According to various embodiments, op-amp 100 is a two stage op-amp including differential input stage 102 and negative gain stage 104, where frequency compensation is provided through compensation capacitor 108 and positive gain compensation stage 106, which are coupled in series from output node $V_{OUT}$ (which correspondingly has a voltage $V_{OUT}$) to intermediate node $V_1$ (which correspondingly has a voltage $V_1$). A conventional voltage-buffer compensation technique includes a frequency compensation series path of a voltage buffer, which has a unity gain, and a compensation capacitor. In contrast, according to various embodiments, positive gain compensation stage 106 has a positive gain K that is greater than 1. In some various embodiments, positive gain K is greater than or equal to 2 and less than or equal to 50. In particular embodiments, positive gain K is greater than or equal to 5 and less than or equal to 25.

According to various embodiments, including positive gain compensation stage 106 with positive gain K may provide various beneficial effects. For example, the effective capacitance at intermediate node $V_1$ is increased by a factor of positive gain K. Thus, implementing positive gain compensation stage 106 may enable using a physically smaller compensation capacitor 108 (which leads to saved semiconductor die area for integrated embodiments), while maintaining a same effective compensation capacitance at intermediate node $V_1$. As another example, positive gain compensation stage 106 may additionally shift the location of the non-dominant pole to a higher frequency, which allows using a smaller compensation capacitor, thus increasing the gain-bandwidth product of operation for op-amp 100, which was an unexpected consequence of including positive gain compensation stage 106. Further, positive gain compensation stage 106 helps to prevent the formation of a right half plane (RHP) zero. Various details and analysis of the characteristics of embodiment op-amps are further described hereinafter in reference to FIGS. 3A, 3B, 4A, and 4B, for example.

Differential input stage 102 has an inverting input terminal coupled to the non-inverting input node of the overall amplifier, V+, a non-inverting input terminal coupled to the inverting input node of the overall amplifier, V−, and an output terminal coupled to intermediate node $V_1$. In various embodiments, capacitance C1 is an overall load capacitance of differential input stage 102, not including the contribution of compensating capacitance CC, and includes an output capacitance of differential input stage 102 and an input capacitance of negative gain stage 104. Similarly, negative gain stage 104 has an input terminal coupled to intermediate node $V_1$ and an output terminal coupled to output node $V_{OUT}$, which has capacitance CL represented by load capacitance 110. Op-amp 100 is an embodiment implementation with two stages, differential input stage 102 and negative gain stage 104. In other embodiments, any number of stages may be included and the various stages may include differential stages, negative gain stages, or positive gain stages in different embodiments. Additional exemplary embodiments are described hereinafter.

FIG. 1B illustrates one embodiment circuit level implementation of op-amp 100. In various embodiments, op-amp 100 may be implemented using CMOS technology. In alternative embodiments, op-amp 100 may be implemented using any type of IC fabrication process or discrete elements. In various embodiments, positive gain K of positive gain compensation stage 106 is accurately set and the bandwidth is implemented to be wide enough to shift the non-dominant pole to a target frequency value (based on a desired gain-bandwidth product specification for a particular embodiment implementation). In particular embodiments, the bandwidth of positive gain compensation stage 106 is set to be larger than the highest frequency of the gain-bandwidth product of op-amp 100, which is based on the non-dominant pole.

According to some embodiments, positive gain compensation stage 106 is implemented using an open-loop scheme including transistors PB1, PB2, NB1, and NB2, which are coupled from output node $V_{OUT}$ between transistors P3 and N4 to the second terminal, e.g., the schematically illustrated bottom plate in FIG. 1B, of compensation capacitor 108. Negative gain stage 104 includes transistors P3 and N4, and the first terminal, e.g., the schematically illustrated top plate in FIG. 1B, of compensation capacitor 108 is coupled to the gate of transistor P3 at intermediate node $V_1$. Differential input stage 102 includes differential input transistors N1 and N2 that are coupled to two branches of a current mirror formed by transistors P1 and P2 and biased by bias transistor N3, which has a gate coupled to bias node $V_B$ (which correspondingly has a voltage $V_B$). The gates of input transistors N1 and N2 are coupled to inverting input node V− and non-inverting input node V+, respectively. Each of differential input stage 102, positive gain compensation stage 106, and negative gain stage 104 are coupled between supply rails having a positive supply reference voltage $V_{DD}$ and a low supply reference voltage, which may be ground GND.

In various embodiments, the signal current generated by voltage $V_{OUT}$ in transistor NB1 is mirrored through transistors PB1 and PB2 to diode connected transistor NB2, thus generating a signal voltage at the drain/gate terminal of diode connected transistor NB2 with a gain factor K of $$K = N \frac{g_{mNB1}}{g_{mNB2}},$$

where $g_{mNB1}$ is the transconductance of transistor NB1, $g_{mNB2}$ is the transconductance of diode connected transistor NB2, and N is the sizing ratio N:1 of transistor PB2 to PB1.

In various such embodiments, K may be adjusted by setting the mirror factor N and/or the ratio of the transconductances of transistors NB1 and NB2. In specific embodiments, both the mirror factor N and the ratio of the transconductances are adjusted with high accuracy through the layout design of positive gain compensation stage 106.

Figure 2A:
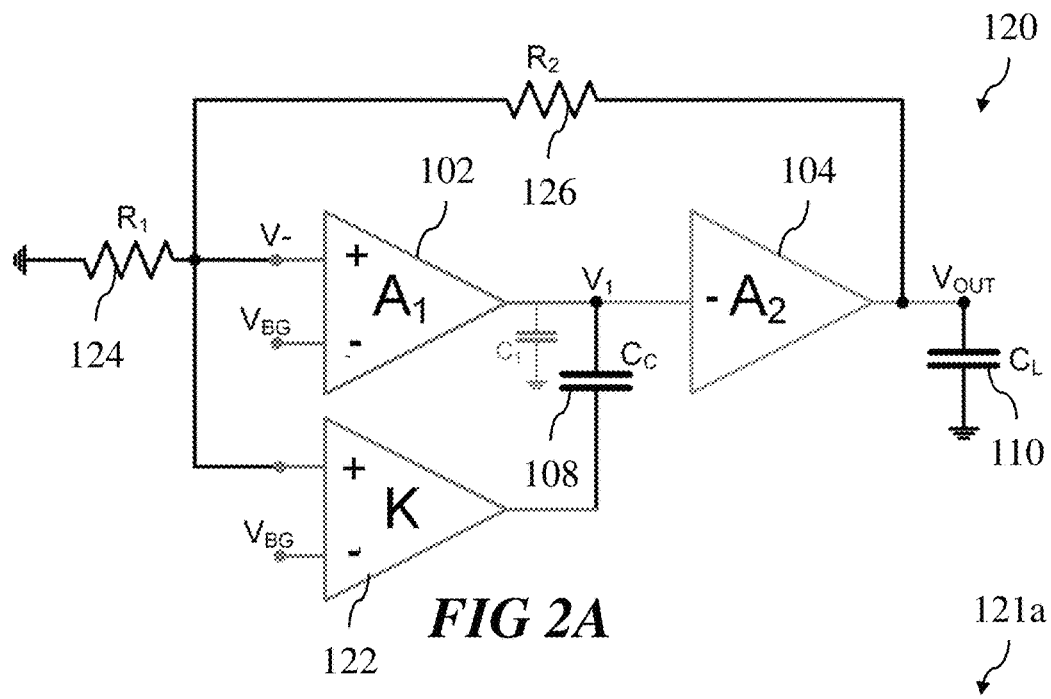
FIGS. 2A, 2B, and 2C illustrate a block diagram and circuit schematics of further embodiment operational amplifiers.
Figure 2B:
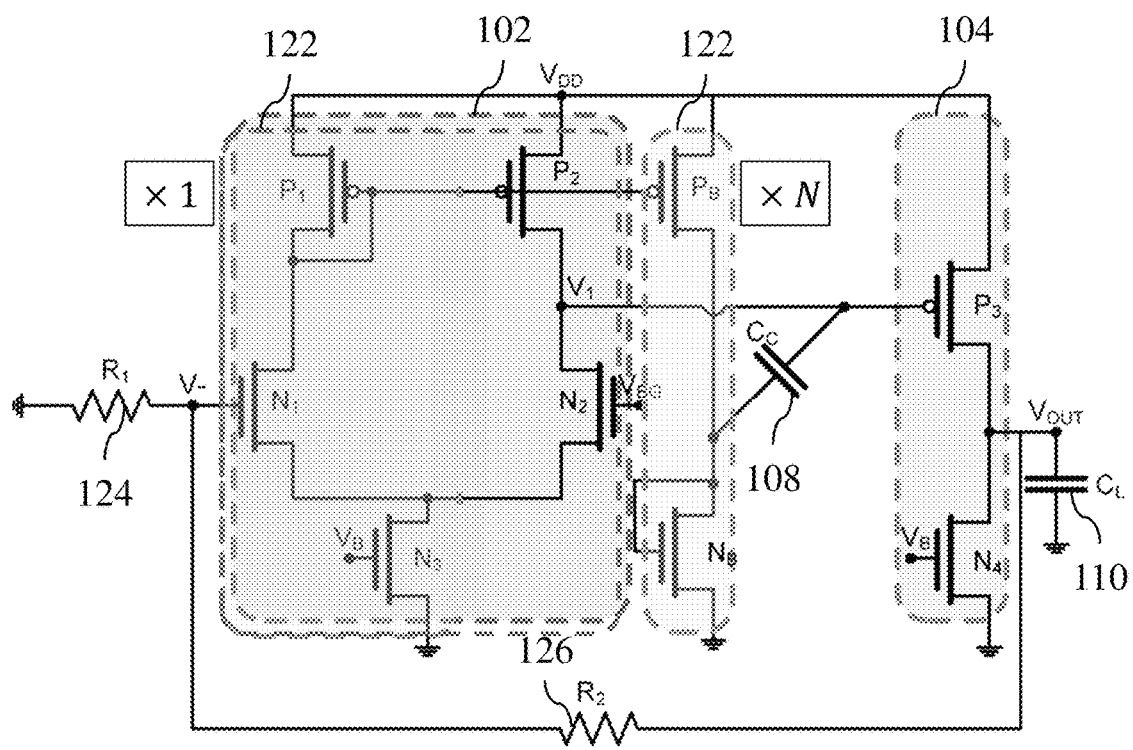
Figure 2C:
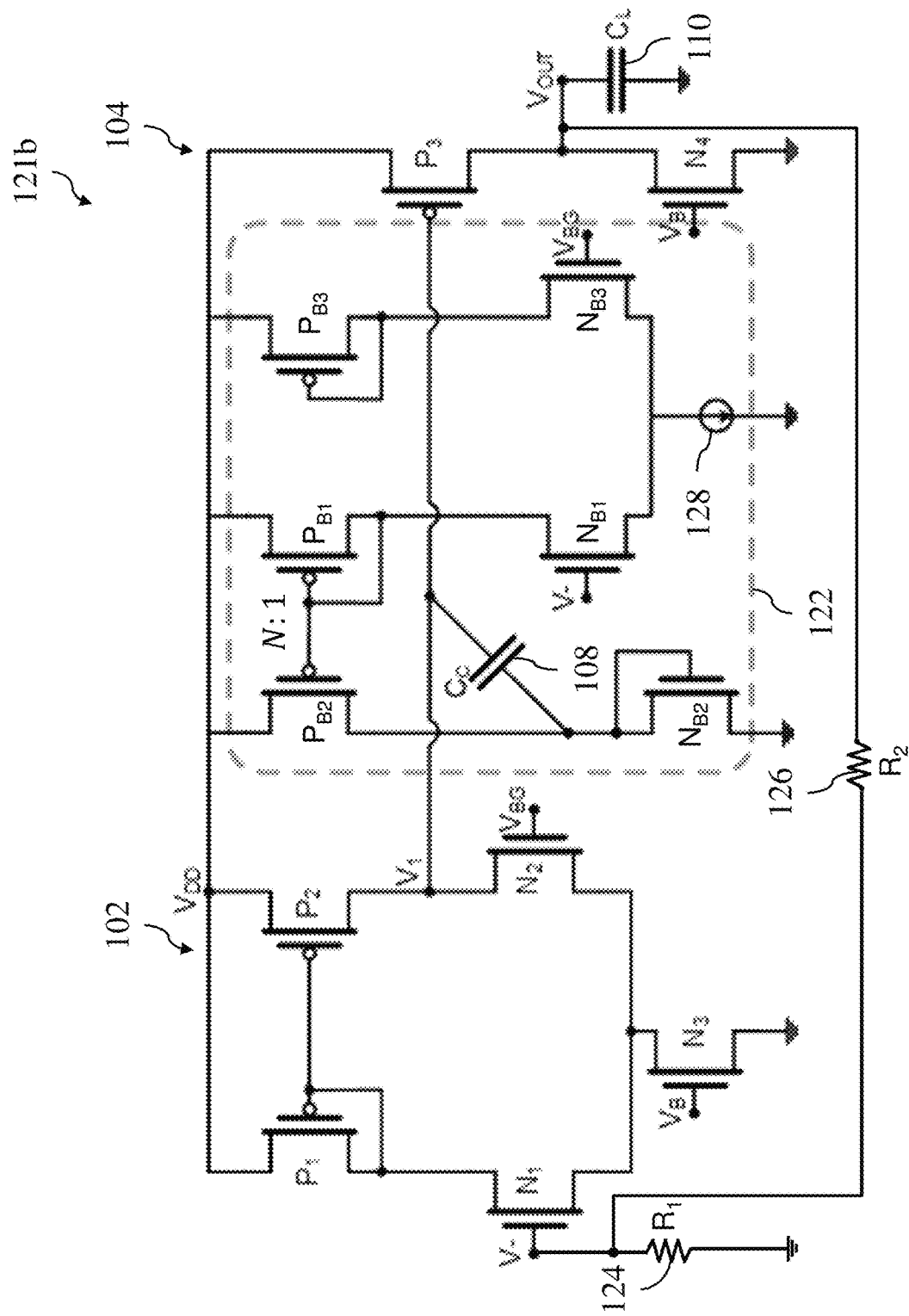

FIGS. 2A, 2B, and 2C illustrate a block diagram and circuit schematics of further embodiment operational amplifiers. Specifically, FIG. 2A illustrates a block diagram of op-amp 120 and FIGS. 2B and 2C illustrate circuit schematics of embodiment op-amps 121a and 121b, which are two embodiment circuit level implementations of op-amp 120. According to various embodiments, op-amp 120 includes differential input stage 102, negative gain stage 104, compensation capacitor 108, and load capacitance 110, as described hereinabove in reference to op-amp 100 in FIGS. 1A and 1B. Op-amp 120 also includes positive gain compensation stage 122 and resistors 124 and 126. In various embodiments, positive gain compensation stage 122 includes positive gain K and functions in a similar manner as described hereinabove in reference to positive gain compensation stage 106 in FIGS. 1A and 1B. In such embodiments, positive gain compensation stage 122 is implemented according to a specific embodiment using a differential input amplifier stage, as illustrated in FIGS. 2A and 2C, or using a merged design, as illustrated in FIG. 2B.

In various such embodiments, positive gain compensation stage 122 is a differential input amplifier with a positive terminal coupled to inverting input node V−, a negative terminal coupled to bandgap reference node $V_{BG}$ (which correspondingly has a voltage $V_{BG}$), and an output terminal coupled to compensation capacitor 108. In various further embodiments, bandgap reference node $V_{BG}$ may be provided as any type of reference voltage node and, in alternative embodiments, is not provided by a bandgap reference circuit. Differential input stage 102 also has a positive terminal coupled to inverting input node V− and a negative terminal coupled to bandgap node $V_{BG}$.

According to various embodiments, resistors 124 and 126 are coupled as a resistive divider circuit between inverting input node V− and output node $V_{OUT}$. In specific embodiments, resistor 124 is coupled from a low supply reference voltage, which may be ground GND, to inverting input node V−, and resistor 126 is coupled from inverting input node V− to output node $V_{OUT}$. In various embodiments, resistor 124 has resistance value R1 and resistor 126 has resistance value R2.

According to various embodiments, op-amps 121a and 121b, illustrated in FIGS. 2B and 2C, are two embodiment circuit level implementations of op-amp 120, as described hereinabove in reference to FIG. 2A. According to various embodiments, differential input stage 102 includes transistors N1, N2, P1, P2, and N3, as similarly described hereinabove in reference to FIG. 1B. Similarly, negative gain stage 104 includes transistor P3 and N4, as similarly described hereinabove in reference to FIG. 1B.

According to specific embodiments, op-amp 121a in FIG. 2B includes positive gain compensation stage 122 implemented as an overlapping gain stage with differential input stage 102. In such embodiments, positive gain compensation stage 122 includes transistors N1, P1, as a first current branch, with biasing from transistor N3, and transistors PB and NB as a second current branch, where transistor NB is diode connected. The first current branch is coupled to the second current branch through the current mirror formed by transistors P1 and PB. In such embodiments, the gate of transistor N1 is controlled based on a coupling to output node $V_{OUT}$ through the resistive divider circuit formed by resistors 124 and 126. In a mechanism similar to that described hereinabove in reference to FIG. 1B, the signal current in transistor N1 is mirrored through transistors P1 and PB to diode connected transistor NB, thus generating a signal voltage at the drain/gate terminal of NB with a gain factor K of $$K = \frac{N}{2} \frac{g_{mN1}}{g_{mNB}} \frac{R_1}{R_1 + R_2},$$

where $g_{mN1}$ is the transconductance of transistor N1, $g_{mNB}$ is the transconductance of diode connected transistor NB, and N is the sizing ratio N:1 of transistor PB to P1, and a modification to the gain factor K is present due to the presence of resistors 124 and 126 and the differential pair consisting of transistors N1 and N2 biased by transistor N3. In such embodiments, transistors N1, P1, N2, P2, and N3 are shared between positive gain compensation stage 122 and differential input stage 102.

According to other specific embodiments, op-amp 121b in FIG. 2C includes positive gain compensation stage 122 implemented as a non-overlapping differential gain stage. In such embodiments, positive gain compensation stage 122 includes a differential input stage with transistors NB1 and NB3, which are biased by current source 128. The differential input stage of positive gain compensation stage 122 includes a first branch with transistor NB3, having a gate coupled to bandgap voltage node $V_{BG}$, coupled in series with diode connected transistor PB3 from the supply rail with positive supply reference voltage $V_{DD}$. The differential input stage of positive gain compensation stage 122 includes a second branch with transistor NB1, having a gate coupled to inverting input node V−, coupled in series with a first current branch of a current mirror in positive gain compensation stage 122, which includes transistors PB1 and PB2. The second current branch of the current mirror in positive gain compensation stage 122 is coupled to diode connected transistor NB2 and compensation capacitor 108.

In such embodiments, positive gain compensation stage 122 includes the differential input positive gain structure as described hereinabove in reference to FIG. 2A and does not include overlapping components, as an alternative to the embodiment described in reference to FIG. 2B. According to various embodiments, output node $V_{OUT}$ may be coupled to inverting input node V− through the resistive divider circuit formed by resistors 124 and 126, as described hereinabove in reference to FIGS. 2A and 2B. In a mechanism similar to that described hereinabove in reference to FIGS. 1B and 2B, the signal current in transistor NB1 is mirrored through transistors PB1 and PB2 to diode connected transistor NB2, thus generating a signal voltage at the drain/gate terminal of diode connected transistor NB2 with a gain factor K of $$K = \frac{N}{2} \frac{g_{mNB1}}{g_{mNB2}},$$

where $g_{mNB1}$ is the transconductance of transistor NB1, $g_{mNB2}$ is the transconductance of diode connected transistor NB2, and N is the sizing ratio N:1 of transistor PB2 to PB1. As described hereinabove in reference to FIG. 2B, a modification to the gain factor K of $R_1/(R_1+R_2)$ may be present when resistors 124 and 126 are included.

In various embodiments, referring specifically to op-amp 120, op-amp 121a, and op-amp 121b, inverting input node V− may operate as a virtual ground that is a consequence of the negative feedback loop produced by the resistive divider circuit formed by resistors 124 and 126. In such embodiments, the voltage of inverting input node V− is maintained equal to the voltage at bandgap reference node $V_{BG}$. In particular such embodiments, output voltage $V_{OUT}$ may be an amplified version of the voltage at bandgap reference node $V_{BG}$ due to the resistive divider circuit formed by resistors 124 and 126. In such various embodiments, the resistive divider circuit formed by resistors 124 and 126 provides a feedback path for positive gain compensation stage 122 and allows the input of positive gain compensation stage 122 to avoid a direct connection to output node $V_{OUT}$.

Figure 3A:
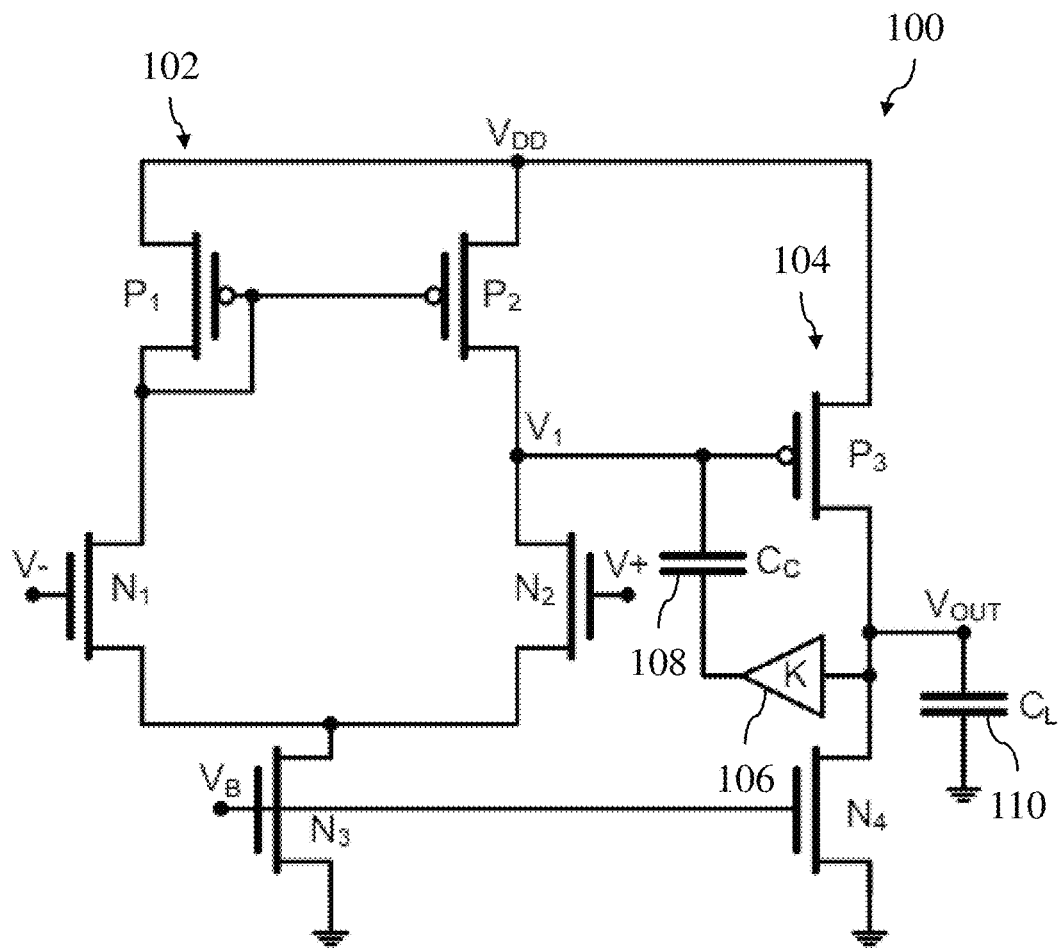
FIGS. 3A and 3B illustrate schematics of an embodiment operational amplifier and a corresponding small-signal equivalent model.
Figure 3B:
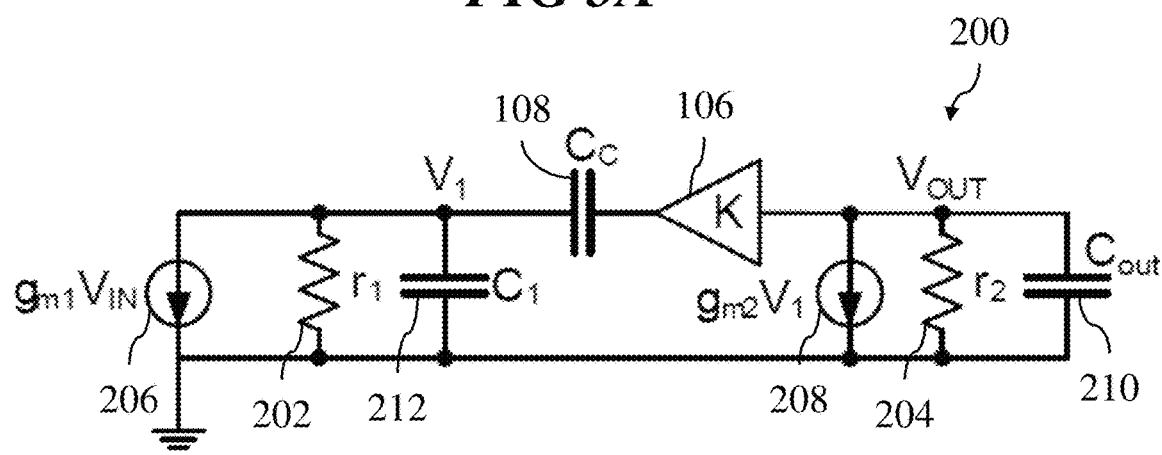

FIGS. 3A and 3B illustrate schematics of an embodiment operational amplifier (op-amp) 100 and a corresponding small-signal equivalent model 200. According to various embodiments, op-amp 100 includes structures and elements as described hereinabove in reference to FIGS. 1A and 1B, but is illustrated as a mixed schematic diagram with positive gain compensation stage 106 illustrated as a functional block. In such embodiments, output voltage $V_{OUT}$ (at output node $V_{OUT}$) is multiplied by positive gain factor K before being applied to the top plate of compensation capacitor 108, which enhances the Miller effect and, thus, increases the effective value of compensation capacitance CC by an additional factor of K.

According to various embodiments, small-signal equivalent model 200, as illustrated in FIG. 3B, includes equivalent resistances 202 and 204 (having resistance values r1 and r2), intermediate equivalent capacitance 212 (having capacitance value C1), compensation capacitor 108, positive gain compensation stage 106, output capacitance 210 (having capacitance value COUT) and variable current sources 206 and 208 (having current values $g_{m1} \cdot V_{IN}$, where $V_{IN}=V^+-V^-$, and $g_{m2} \cdot V_1$, respectively). In such embodiments, capacitance value C1 corresponds to the overall capacitance at intermediate node $V_1$ (not including the contribution of compensating capacitance CC), resistance value r1 corresponds to the equivalent output resistance of differential input stage 102, resistance value r2 corresponds to the equivalent output resistance of negative gain stage 104, capacitance value COUT corresponds to the overall capacitance at node output VOUT, and current values $g_{m1}*V_{IN}$ and $g_{m2}*V_1$ are voltage controlled current sources that are used to model differential-pair transistors P1 and P2 and transistor P3, respectively.

In such embodiments, small-signal equivalent model 200 has two poles, which are associated with the output of the first stage, differential input stage 102, and the second stage, negative gain stage 104, respectively. Using the assumptions $K \cdot r2 \cdot g_{m2} \gg 1$, $CC \gg COUT/K \cdot r2 \cdot g_{m2}$, and $CC \gg C1$, the first, dominant, pole frequency is given by the expression $$\omega_{p1} = \frac{1}{r_1 r_2 g_{m2} C_C K},$$

and the second, non-dominant, pole frequency is given by the expression $$\omega_{p2} = K \frac{g_{m2}}{C_{OUT}} \frac{C_C}{C_1 + C_C}.$$

In various such embodiments, positive gain compensation stage 106 enhances the Miller effect, which pushes the dominant pole $\omega_{p1}$ to a frequency K times lower with respect to standard Miller compensation using unity gain voltage-buffer compensation. Further, the gain-bandwidth product is given by the expression $\omega_0 = g_{m1}/(K \cdot CC)$. As can be seen from the expression for the non-dominant pole $\omega_{p2}$, the second, non-dominant, pole $\omega_{p2}$ is moved to a frequency that is higher by a factor $K \cdot CC/(C1+CC)$ compared to standard Miller compensation using unity gain voltage-buffer compensation. In such embodiments, at sufficiently high frequencies, the signal voltage at the schematically illustrated top plate of compensation capacitor 108 is substantially equal to $V_{OUT} \cdot K \cdot CC/(C1+CC)$. The value of ratio $CC/(C1+CC)$ may be close to unity because usually $CC \gg C1$, as assumed hereinabove. Using this approximation for the ratio of $CC/(C1+CC)$, the expression for the second, non-dominant, pole $\omega_{p2}$ can be simplified as $$\omega_{p2} \approx K \frac{g_{m2}}{C_{OUT}}.$$

In various such embodiments, as can be seen from the expressions for the first, dominant, pole $\omega_{p1}$ and the second, non-dominant, pole $\omega_{p2}$, the frequency separation between the first pole and the second pole is increased by an additional factor of $K^2$, as shown by the expression:

$$\frac{\omega_{p2}}{\omega_{p1}} = K^2 \frac{g_{m2}^2 r_1 r_2 C_C^2}{C_{OUT}(C_1 + C_C)} \approx K^2 \frac{g_{m2}^2 r_1 r_2 C_C}{C_{OUT}}.$$

Further, the effective load capacitance of the first stage, differential input stage 102, and the effective output conductance of the second stage at sufficiently high frequencies are simultaneously increased by a factor K. In such embodiments, this increase is seen in the ratio of the second, non-dominant, pole $\omega_{p2}$ to the gain-bandwidth product $\omega_0$, i.e., $\omega_{p2}/\omega_0$, which is increased by a factor of $K^2$:

$$\frac{\omega_{p2}}{\omega_0} = K^2 \frac{g_{m2} C_C}{g_{m1} C_{OUT}}.$$

Based on this ratio of $\omega_{p2}/\omega_0$, it can be seen that for a given target value of $\omega_0$, the use of a gain factor K larger than unity for the same value of capacitance CC for compensation capacitor 108 results in a higher value of the ratio of $\omega_{p2}/\omega_0$ and, hence, in a better stability of op-amp 100. Further, in other embodiments, a value of capacitance CC smaller by a factor larger than K can be used for the same target value of ratio of $\omega_{p2}/\omega_0$, which allows achieving a larger unity-gain frequency (i.e. a larger gain-bandwidth product) of op-amp 100 with less silicon area.

According to various embodiments, including positive gain compensation stage 106 in the compensation path adds a degree of freedom to the implementation of the compensation path. In such embodiments, in order to implement frequency compensation for a given target value of $\omega_0$ and, hence, of $\omega_{p2}$ (where the latter value may be set as a function of the phase margin: $\omega_{p2} = m \cdot \omega_0$, with m>1), the product $K \cdot g_{m2}$ is set to be equal to $m \cdot \omega_0 \cdot COUT$. In such embodiments, the value of capacitance CC of compensation capacitor 108 is set according to the following expression $$C_C = \frac{m}{K^2} \frac{g_{m1}}{g_{m2}} C_{OUT}.$$

According to such embodiments, a K-times larger gain-bandwidth product with capacitance CC that is $K^2$ times smaller is enabled compared to standard Miller compensation using unity gain voltage-buffer compensation.

According to various specific embodiments, the value of positive gain K is limited by an upper limit. In some particular embodiments, positive gain K is set according to the expression $$K^2 \ll m \frac{C_{OUT}}{C_1} \frac{g_{m1}}{g_{m2}}.$$

In a particular embodiment, when the value of K exceeds the above range, the second, non-dominant, pole $\omega_{p2}$ may be shifted to a lower frequency with respect to the formula introduced earlier, which in turn reduces the allowed upper bound of the gain-bandwidth product. According to some example embodiments, positive gain K is greater than or equal to 2 and less than or equal to 50. In particular embodiments, positive gain K is greater than or equal to 5 and less than or equal to 25, for example between 5 and 10.

Figure 4A:
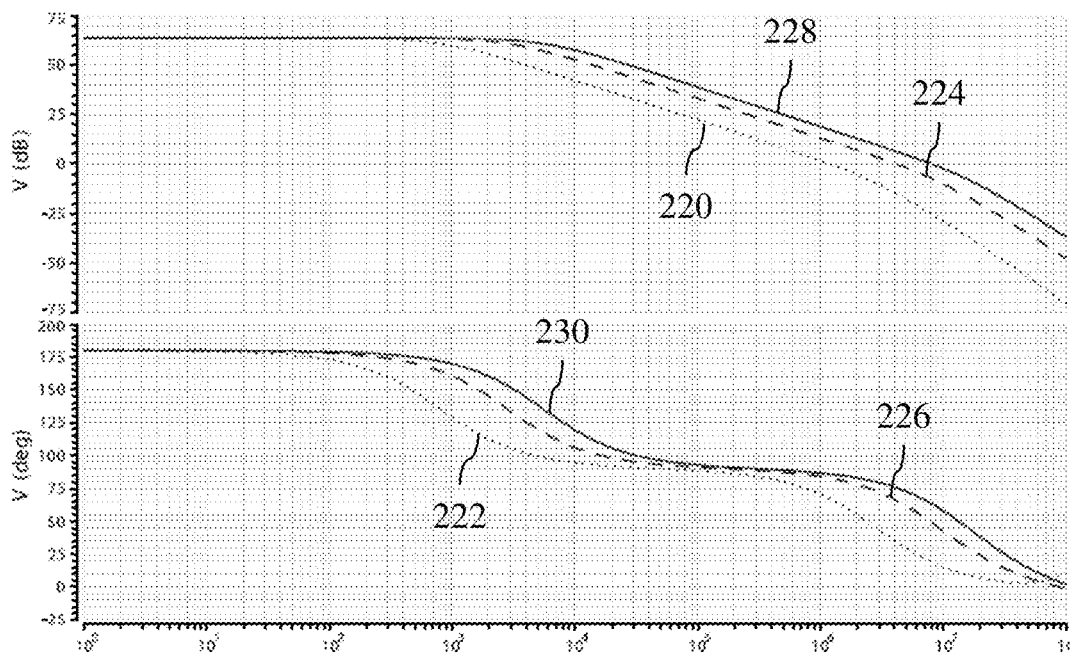
FIGS. 4A and 4B illustrate Bode plots of simulated operational amplifiers.
Figure 4B:
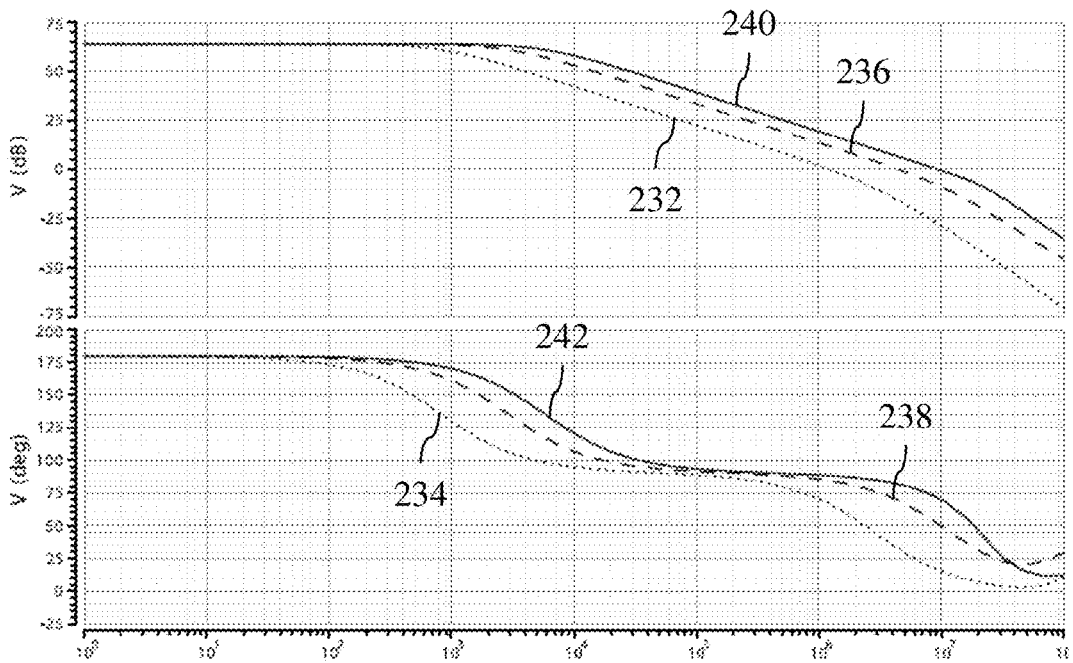

FIGS. 4A and 4B illustrate Bode plots of simulated operational amplifiers. According to various embodiments, FIG. 4A illustrates the simulated frequency response of op-amp 100 as illustrated in FIG. 1B using an ideal amplifying buffer as the positive gain compensation stage in the op-amp compensation network. In such embodiments, using an ideal amplifying buffer removes non-idealities of a real buffer, such as finite bandwidth, non-zero output resistance, and capacitances. In particular embodiments, FIG. 4A illustrates the simulated magnitude (top plot, V dB) and phase (bottom plot, V deg) for three different instances of op-amps. Specifically, magnitude plot 220 and phase plot 222 (dotted lines) illustrate the ideal voltage-buffer compensation scheme with K=1 and CC=15.5 pF, magnitude plot 224 and phase plot 226 (dashed lines) illustrate the proposed ideal enhanced voltage-buffer compensation scheme with K=3.5 and CC=1.27 pF, and magnitude plot 228 and phase plot 230 (solid lines) illustrate the proposed ideal enhanced voltage-buffer compensation scheme with K=7 and CC=0.316 pF. All other circuit parameters (including, in particular, $g_{m1}$, $g_{m2}$, $r_1$, $r_2$, $C_{OUT}$, and $C_1$) were kept consistent throughout each of the embodiment simulations.

Thus, various embodiment op-amps implementing embodiment compensation techniques may provide a gain-bandwidth product enhanced by a factor of K with a compensation capacitor size reduced by a factor of $K^2$ for positive gain K. Further, the frequency position of the first (dominant) and the second (non-dominant) poles may be shifted further apart based on positive gain K.

According to various embodiments, FIG. 4B illustrates the simulated frequency response using a transistor level model for an amplifying buffer as the positive gain compensation stage in the op-amp compensation network. For example, FIG. 4B may correspond to the transistor level implementation described hereinabove in reference to op-amp 100 in FIG. 1B. In particular embodiments, FIG. 4B illustrates the simulated magnitude (top plot, V dB) and phase (bottom plot, V deg) for three different instances of op-amps. Specifically, magnitude plot 232 and phase plot 234 (dotted lines) illustrate the voltage-buffer compensation scheme with K=1 and CC=15.5 pF, magnitude plot 236 and phase plot 238 (dashed lines) illustrate the proposed enhanced voltage-buffer compensation scheme with K=3.47 and CC=1.29 pF, and magnitude plot 240 and phase plot 242 (solid lines) illustrate the proposed enhanced voltage-buffer compensation scheme with K=7.2 and CC=0.299 pF.

Description has been provided hereinabove primarily in reference to multistage op-amps having two stages, such as differential input stage 102 and negative gain stage 104 in FIGS. 1A and 1B, for example. According to various embodiments, op-amps include any number of stages such as two, three, or more stages, for example. FIGS. 5A, 5B, 5C, 5D, and 5E illustrate block diagrams of additional embodiment operational amplifiers (op-amps) having three stages.

Figure 5A:
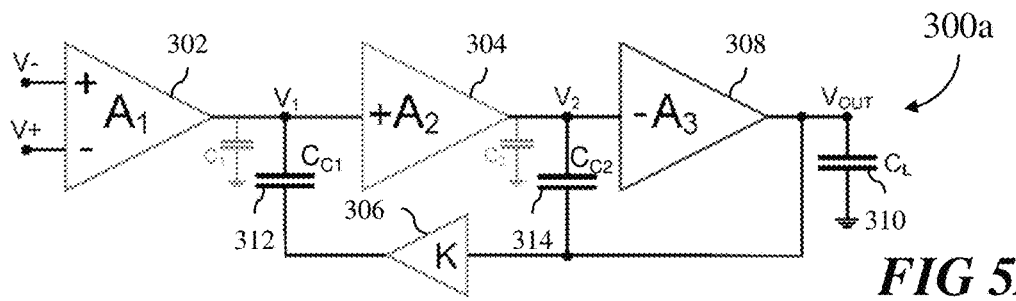
FIGS. 5A, 5B, 5C, 5D, and 5E illustrate block diagrams of additional embodiment operational amplifiers.

FIG. 5A illustrates a block diagram of embodiment op-amp 300a including differential input stage 302, positive gain stage 304, negative gain stage 308, and positive gain compensation stage 306. According to various embodiments, op-amp 300a may include two compensation capacitors 312 and 314 having compensation capacitances CC1 and CC2, respectively. In such embodiments, positive gain compensation stage 306 is coupled from output node $V_{OUT}$ to a second terminal, e.g., the schematically illustrated bottom plate in FIG. 5A, of compensation capacitor 312, where a first terminal, e.g., the schematically illustrated top plate in FIG. 5A, of compensation capacitor 312 is coupled to intermediate node $V_1$. Output node $V_{OUT}$ is also coupled to intermediate node $V_2$ through compensation capacitor 314, which has a first terminal coupled to intermediate node $V_2$ and a second terminal coupled to output node $V_{OUT}$. In various embodiments, positive gain stage 306 may be implemented as similarly described hereinabove in reference to positive gain stages 106 or 122 in the other Figures.

According to various embodiments, differential input stage 302 has a non-inverting input terminal coupled to inverting input node V−, an inverting input terminal coupled to non-inverting input node V+, and an output terminal coupled to intermediate node $V_1$. Positive gain stage 304 has an input terminal coupled to intermediate node $V_1$ and an output terminal coupled to intermediate node $V_2$. Negative gain stage 308 has an input terminal coupled to intermediate node $V_2$ and an output terminal coupled to output node $V_{OUT}$, which is also coupled to load capacitance 310 (which has a load capacitance CL). In various embodiments, capacitance C1 is the overall load capacitance of differential input stage 302, not including the contribution of compensating capacitance CC1, and includes the output capacitance of differential input stage 302 and the input capacitance of positive gain stage 304; and capacitance C2 is the overall load capacitance of positive gain stage 304, not including the contribution of compensating capacitance CC2, and includes the output capacitance of positive gain stage 304 and the input capacitance of negative gain stage 308.

Figure 5B:
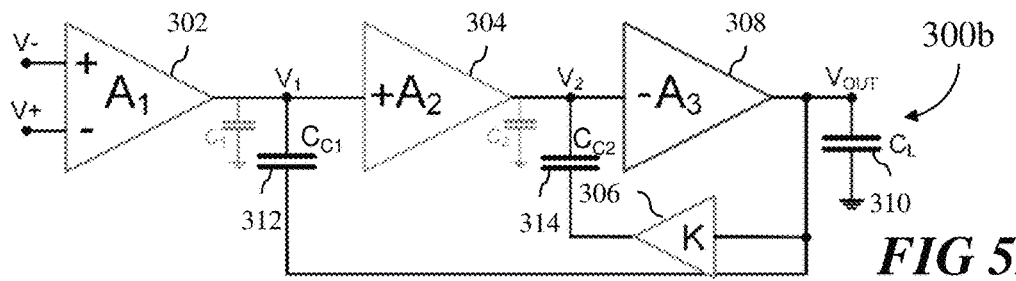

FIG. 5B illustrates a block diagram of embodiment op-amp 300b including differential input stage 302, positive gain stage 304, negative gain stage 308, and positive gain compensation stage 306. According to various embodiments, op-amp 300b includes positive gain compensation stage 306 coupled from output node $V_{OUT}$ to a second terminal of compensation capacitor 314, which has a first terminal coupled to intermediate node $V_2$. Output node $V_{OUT}$ is also coupled to intermediate node $V_1$ through compensation capacitor 312, which has a first terminal coupled to intermediate node $V_1$ and a second terminal coupled to output node $V_{OUT}$.

Figure 5C:
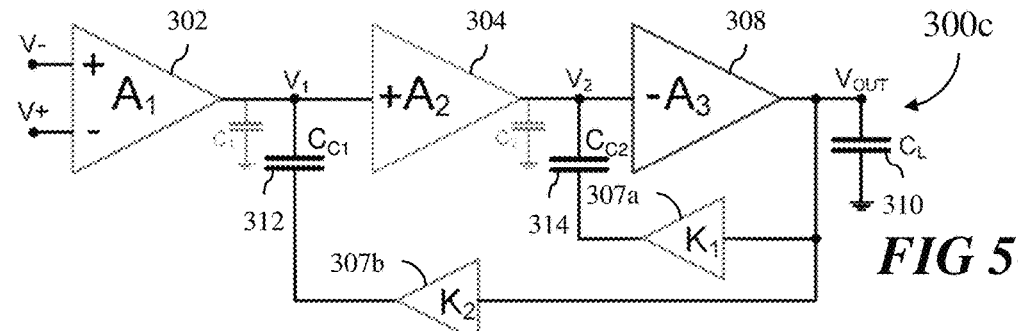

FIG. 5C illustrates a block diagram of embodiment op-amp 300c including differential input stage 302, positive gain stage 304, negative gain stage 308, positive gain compensation stage 307a, and positive gain compensation stage 307b. According to various embodiments, op-amp 300c includes two positive gain compensation stages 307a and 307b, which may be implemented in a similar manner as positive gain compensation stage 306. In such embodiments, positive gain compensation stage 307a is coupled from output node $V_{OUT}$ to a second terminal of compensation capacitor 314, which has a first terminal coupled to intermediate node $V_2$. Positive gain compensation stage 307b is coupled from output node $V_{OUT}$ to a second terminal of compensation capacitor 312, which has a first terminal coupled to intermediate node $V_1$.

Figure 5D:
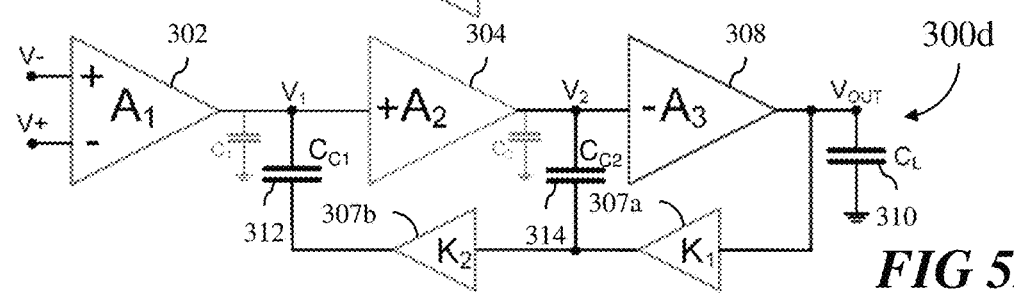

FIG. 5D illustrates a block diagram of embodiment op-amp 300d including differential input stage 302, positive gain stage 304, negative gain stage 308, positive gain compensation stage 307a, and positive gain compensation stage 307b. According to various embodiments, positive gain compensation stage 307a is coupled from output node $V_{OUT}$ to a second terminal of compensation capacitor 314, which has a first terminal coupled to intermediate node $V_2$. Positive gain compensation stage 307b is coupled from the second terminal of compensation capacitor 314 and the output terminal of positive gain compensation stage 307a to a second terminal of compensation capacitor 312, which has a first terminal coupled to intermediate node $V_1$.

Figure 5E:
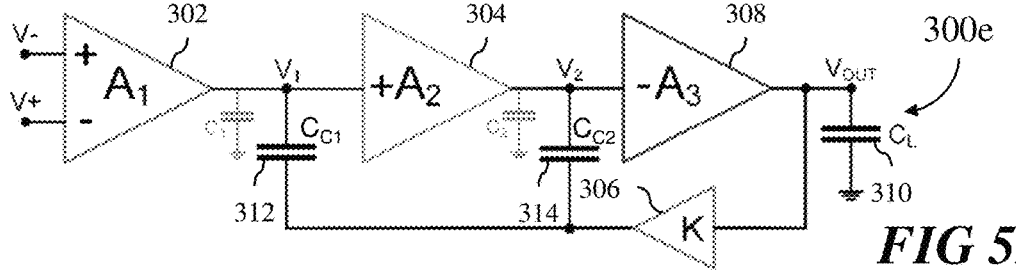

FIG. 5E illustrates a block diagram of embodiment op-amp 300e including differential input stage 302, positive gain stage 304, negative gain stage 308, and positive gain compensation stage 306. According to various embodiments, positive gain compensation stage 306 is coupled from output node $V_{OUT}$ to a second terminal of compensation capacitor 314, which has a first terminal coupled to intermediate node $V_2$, and to a second terminal of compensation capacitor 312, which has a first terminal coupled to intermediate node $V_1$.

According to various embodiments, the implementation of differential input stage 302, negative gain stage 308, and positive gain compensation stage 306 may be performed as similarly described hereinabove in reference to similar elements in FIGS. 1A, 1B, 2A, 2B, and 2C. In various embodiments, positive gain stage 304 may be implemented using similar elements with modifications or further known implementations as will be readily appreciated by those of skill in the art. In further embodiments, various modifications and additions may be included as will be readily apparent to those of skill in the art. Further exemplary embodiments are described hereinafter in reference to FIGS. 6A and 6B. Modification, addition, rearrangement, and combination of the specific embodiments described herein, as will be readily apparent to those of skill in the art, are envisioned in additional embodiments. For example, various additional embodiments include multistage op-amps with four, five, or more stages, and each stage may have a differential input or a single-ended input and a differential output or a single-ended output.

Figure 6A:
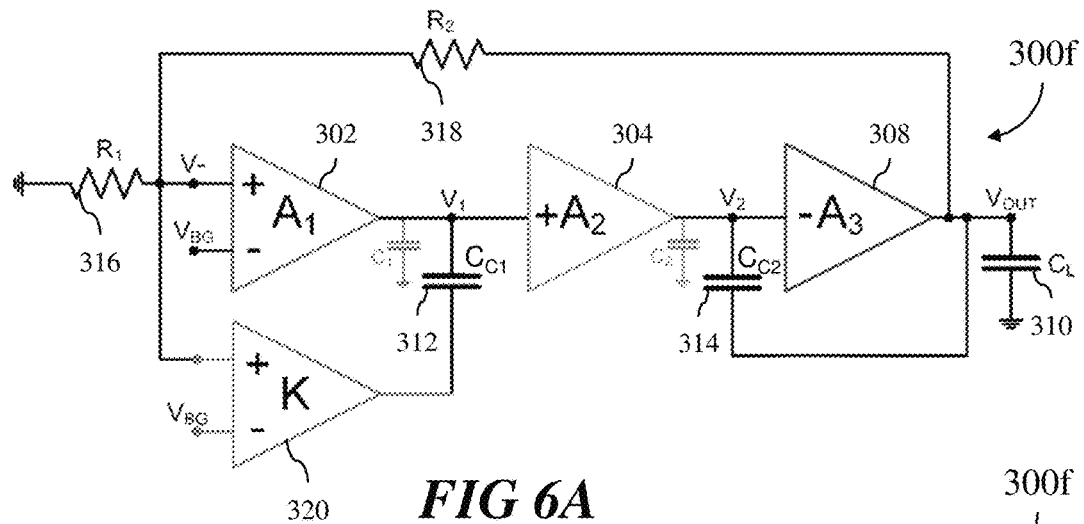
FIGS. 6A and 6B illustrate a block diagram and a circuit schematic of another embodiment operational amplifier.
Figure 6B:
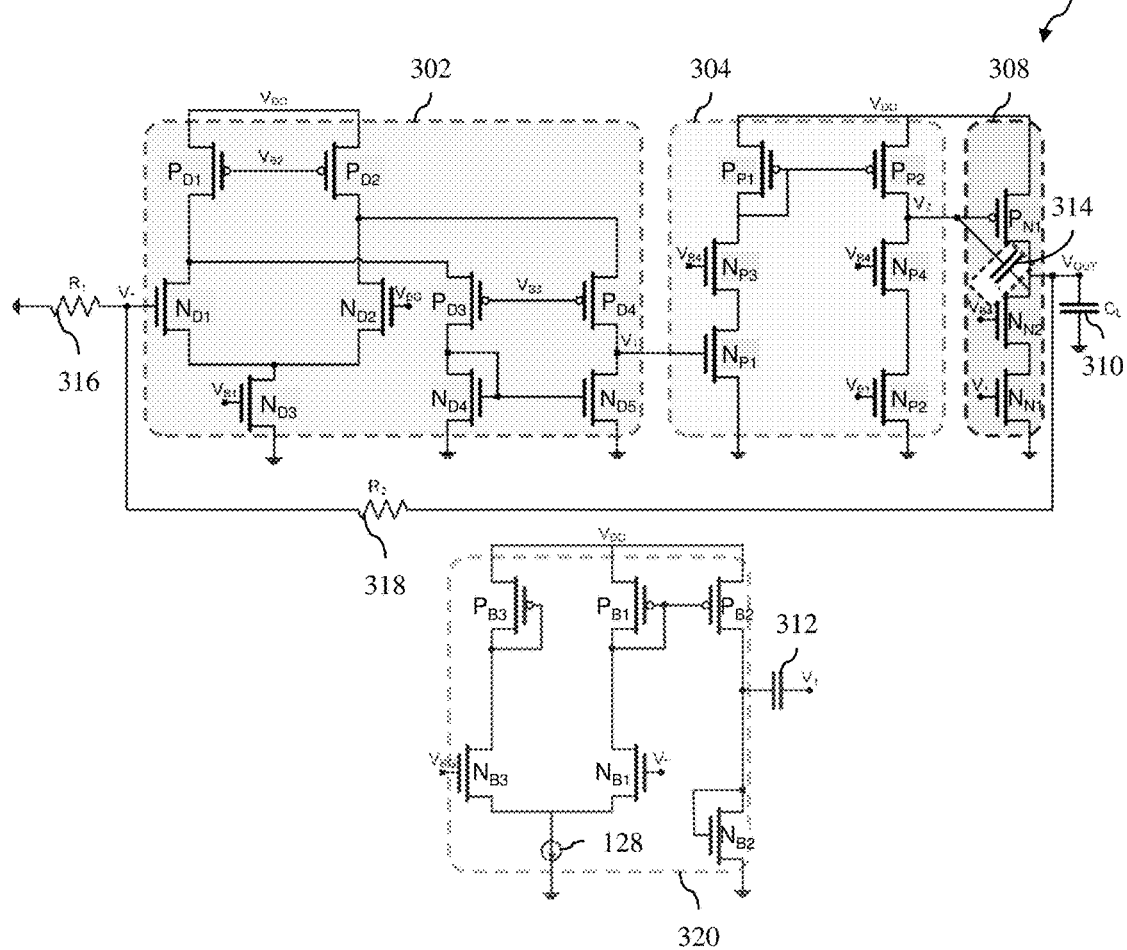

FIGS. 6A and 6B illustrate a block diagram and a circuit schematic of another embodiment operational amplifier (op-amp) 300f including differential input stage 302, positive gain stage 304, negative gain stage 308, and positive gain compensation stage 320. According to various embodiments, op-amp 300f includes positive gain compensation stage 320, which is a differential input positive gain amplifier that may be one specific further embodiment implementation of positive gain compensation stage 306 as a differential input amplifier. In particular embodiments, positive gain compensation stage 320 may be implemented as described hereinabove in reference to positive gain compensation stage 122 in FIG. 2C.

In various embodiments, positive gain compensation stage 320 is coupled from inverting input node V− to a second terminal of compensation capacitor 312, which has a first terminal coupled to intermediate node $V_1$. In such embodiments, a non-inverting input terminal of positive gain compensation stage 320 is coupled to inverting input node V− and a negative terminal of positive gain compensation stage 320 is coupled to bandgap reference node $V_{BG}$. Inverting input node V− is further coupled to output node $V_{OUT}$ through the resistive divider circuit formed by resistors 316 and 318, as described hereinabove in reference to resistors 124 and 126 in FIGS. 2A, 2B, and 2C. Output node $V_{OUT}$ is also coupled to intermediate node $V_2$ through compensation capacitor 314, which has a first terminal coupled to intermediate node $V_2$ and a second terminal coupled to output node $V_{OUT}$.

According to various embodiments, FIG. 6B illustrates a circuit level implementation of op-amp 300f. In such embodiments, positive gain compensation stage 320 includes a differential input stage with transistors NB1 and NB3, a first branch with transistor NB3 coupled in series with diode connected transistor PB3, a second branch with transistor NB1 coupled in series with a first current branch of a current mirror (which includes transistors PB1 and PB2), and a second current branch of the current mirror that is coupled to diode connected transistor NB2 and compensation capacitor 312. The configuration of positive gain compensation stage 320 is described hereinabove in reference to the similar configuration of positive gain compensation stage 122 in FIG. 2C. In FIG. 6B, positive gain compensation stage 320 is illustrated separately from differential input stage 302, positive gain stage 304, and negative gain stage 308 in order to improve the clarity of the illustration; however, positive gain compensation stage 320 is clearly coupled to inverting input node V− and intermediate node $V_1$, as shown by the labels at the gate of transistor NB1 and the first terminal of compensation capacitor 312, respectively.

According to various embodiments, negative gain stage 308 includes transistors $PN_1$, NN1 and NN2, and a first terminal of compensation capacitor 314 is coupled to the gate of transistor PN1 at intermediate node $V_2$. Transistors PN1 and NN2 are coupled together at output node $V_{OUT}$, which is coupled to a second terminal of compensation capacitor 314. The gate of transistor NN2 is coupled to bias node $V_{B4}$ (which correspondingly has a bias voltage $V_{B4}$), and the gate of transistor NN1 is coupled to intermediate node $V_1$. According to various embodiments, negative gain stage 308 is a class AB output stage.

In various embodiments, positive gain stage 304 includes a current mirror with transistors PP1 and PP2 forming first and second current branches, respectively. Positive gain stage 304 further includes transistors NP3 and NP1 coupled in series with the first current branch and transistors NP4 and NP2 coupled to the second current branch. The node between transistor PP2 and transistor NP4 forms intermediate node $V_2$ at an output of positive gain stage 304 and an input of negative gain stage 308. Transistors NP3 and NP4 have gates coupled to bias node $V_{B4}$, and transistor NP2 has a gate coupled to bias node VB1 (which correspondingly has a bias voltage VB1). The gate of transistor NP1 is coupled to intermediate node $V_1$ at an output of differential input stage 302 and an input of positive gain stage 304.

In various embodiments, differential input stage 302 includes differential input transistors ND1 and ND2 that are coupled to first and second branches, respectively, of a pair formed by transistors PD1 and PD2 and biased by bias transistor ND3, which has a gate coupled to bias node $V_{B1}$. Transistors PD1 and PD2 have gates coupled to bias node $V_{B2}$ (which correspondingly has a voltage $V_{B2}$). The gates of input transistors ND1 and ND2 are coupled to inverting input node V− and bandgap reference node $V_{BG}$, respectively. The node between transistors PD1 and ND1 is coupled to the conduction path of transistor PD3 and the node between transistors PD2 and ND2 is coupled to the conduction path of transistor PD4, where transistors PD3 and PD4 form a pair having gates coupled to bias node $V_{B3}$ (which correspondingly has a voltage $V_{B3}$). In such embodiments, the pair formed by transistors PD3 and PD4 are coupled to a current mirror formed by transistors ND4 and ND5, where the gates of transistors ND4 and ND5 are coupled together and to the node between transistor ND4 and transistor PD3. The node between transistor PD4 and transistor ND5 forms intermediate node $V_1$ at an output of differential input stage 302 and an input of positive gain stage 304.

According to various embodiments, each of differential input stage 302, positive gain stage 304, negative gain stage 308, and positive gain compensation stage 320 are coupled between supply rails having a positive supply reference voltage $V_{DD}$ and a low supply reference voltage, which may be ground GND.

According to various embodiments described herein, description is primarily presented in reference to a specific orientation of p-type and n-type devices for CMOS ICs. In further embodiments, the configuration of p-type and n-type devices may be switched, along with various other voltage polarities and circuit arrangements, as will be readily appreciated by those of skill in the art.

According to an embodiment, an operational amplifier includes a first amplifier stage coupled between an input node and an intermediate node, a second amplifier stage coupled between the intermediate node and an output node, a compensation capacitor having a first terminal coupled to the intermediate node and a second terminal, and a compensation amplifier coupled between the output node and the second terminal. The compensation amplifier has a positive gain greater than one. Other embodiments include corresponding systems and apparatus, each configured to perform various embodiment methods.

In various embodiments, the compensation amplifier includes a current mirror coupled to the second terminal, an input element coupled between the output node and the current mirror, and a conduction element coupled to the second terminal, where the conduction element is coupled to the input element through the current mirror. In some embodiments, the current mirror includes first and second transistors, where the first and second transistors are sized according to a sizing ratio that is greater than one. In further embodiments, the input element has a transconductance and the conduction element has a conductance, and a ratio of the transconductance to the conductance is greater than one.

In various embodiments, the operational amplifier further includes a resistive divider circuit coupled from the input node to the output node. In some embodiments, the compensation amplifier is coupled to the output node through the resistive divider circuit. In further embodiments, the compensation amplifier is directly connected to the output node.

In various embodiments, the first amplifier stage includes a differential input, single-ended output amplifier, and the second amplifier stage includes a single-ended input, single-ended output amplifier. In some embodiments, the operational amplifier further includes a third amplifier stage coupled from the intermediate node to an input of the second amplifier stage, and an additional compensation capacitor coupled between the output node and the input of the second amplifier stage. In further embodiments, the operational amplifier further includes a third amplifier stage coupled from an output of the first amplifier stage to the intermediate node, and an additional compensation capacitor coupled between the output node and an input of the third amplifier stage.

According to an embodiment, an operational amplifier includes a differential input stage including a non-inverting input terminal, an inverting input terminal, and an output terminal; a single-ended gain stage including an input terminal coupled to the output terminal of the differential input stage and an output terminal; a compensation capacitor including a first terminal coupled to the input terminal of the single-ended gain stage and a second terminal; and a compensation gain stage including an input terminal coupled to the output terminal of the single-ended gain stage and an output terminal coupled to the second terminal of the compensation capacitor. The compensation gain stage has a positive gain greater than one. Other embodiments include corresponding systems and apparatus, each configured to perform various embodiment methods.

In various embodiments, the compensation gain stage includes a first current mirror including a first current branch from a supply rail to a first branch node and a second current branch from the supply rail to a second branch node, the second branch node being coupled to the second terminal of the compensation capacitor, a diode connected transistor including a conduction path coupled from the second branch node to a reference node, and a first input transistor including a conduction path coupled in series with the first current branch and a control terminal coupled to the input terminal of the compensation gain stage. In some embodiments, the compensation gain stage includes transistors shared with the differential input stage. In other embodiments, the compensation gain stage is separate from the differential input stage and does not include shared transistors.

In various embodiments, the first current mirror includes a first current mirror transistor and a second current mirror transistor, the first current mirror transistor and the second current mirror transistor being sized according to a sizing ratio, where the sizing ratio is greater than one. In some embodiments, the input terminal of the compensation gain stage is coupled to the output terminal of the single-ended gain stage through a resistive divider circuit. In further embodiments, the differential input stage includes a second current mirror including a third current branch from a supply rail to a third branch node and a fourth current branch from the supply rail to a fourth branch node, the fourth branch node being coupled to the output terminal of the differential input stage; a second input transistor including a conduction path coupled in series with the third current branch and a control terminal coupled to the inverting input terminal of the differential input stage; and a third input transistor including a conduction path coupled in series with the fourth current branch and a control terminal coupled to the non-inverting input terminal of the differential input stage.

In various embodiments, the differential input stage further includes a bias transistor including a conduction path coupled to the conduction path of the second input transistor and the conduction path of the third input transistor and a control terminal coupled to a bias voltage node. In some embodiments, the single-ended gain stage includes an amplifying transistor including a conduction path coupled from a supply rail to the output terminal of the single-ended gain stage and a control terminal coupled to the input terminal of the single-ended gain stage; and a bias transistor including a conduction path coupled from the output terminal of the single-ended gain stage to a reference node and a control terminal coupled to a bias voltage node.

In various embodiments, the operational amplifier further includes a resistive divider circuit, where the compensation gain stage includes a differential input, single-ended output amplifier including a non-inverting input terminal coupled to a bandgap voltage reference node, an inverting input terminal coupled to the input terminal of the compensation gain stage, and a single-ended output terminal coupled to the output terminal of the compensation gain stage. In such embodiments, the input terminal of the compensation gain stage is coupled to the output terminal of the single-ended gain stage through the resistive divider circuit. In some embodiments, the operational amplifier further includes an additional amplifier stage, where the output terminal of the differential input stage is coupled to the input terminal of the single-ended gain stage through the additional amplifier stage; and an additional compensation capacitor coupled between the output terminal of the single-ended gain stage and an input terminal of the additional amplifier stage.

In various embodiments, the operational amplifier further includes an additional amplifier stage including an input terminal coupled to the output terminal of the single-ended gain stage and an output terminal; and an additional compensation capacitor coupled between the output terminal of the additional amplifier stage and the input terminal of the additional amplifier stage. In such embodiments, the input terminal of the compensation gain stage is coupled to the output terminal of the single-ended gain stage through the additional compensation capacitor.

According to an embodiment, an operational amplifier includes a differential input stage including a first current mirror including a first current branch from a supply rail to a first branch node and a second current branch from the supply rail to a second branch node, the second branch node being coupled to an output terminal of the differential input stage, a first input transistor including a conduction path coupled in series with the first current branch and a control terminal coupled to an inverting input terminal of the differential input stage, and a second input transistor including a conduction path coupled in series with the second current branch and a control terminal coupled to a non-inverting input terminal of the differential input stage. The operational amplifier also includes a single-ended gain stage including an amplifying transistor including a conduction path coupled from a supply rail to an output terminal of the single-ended gain stage and a control terminal coupled to an input terminal of the single-ended gain stage, where the input terminal of the single-ended gain stage is coupled to the output terminal of the differential input stage, and a bias transistor including a conduction path coupled from the output terminal of the single-ended gain stage to a first reference node and a control terminal coupled to a bias voltage node. The operational amplifier also includes a compensation capacitor including a first terminal coupled to the input terminal of the single-ended gain stage and a second terminal. The operational amplifier also includes a compensation gain stage having a positive gain greater than one, where the compensation gain stage includes a second current mirror including a third current branch from the supply rail to a third branch node and a fourth current branch from the supply rail to a fourth branch node, the fourth branch node being coupled to an output terminal of the compensation gain stage, where the output terminal of the compensation gain stage is coupled to the second terminal of the compensation capacitor; a diode connected transistor including a conduction path coupled from the fourth branch node to a second reference node; and a third input transistor including a conduction path coupled in series with the third current branch and a control terminal coupled to an input terminal of the compensation gain stage, where the input terminal of the compensation gain stage is coupled to the output terminal of the single-ended gain stage. Other embodiments include corresponding systems and apparatus, each configured to perform various embodiment methods.

In various embodiments, the first current mirror and the second current mirror include overlapping elements such that the first current branch and third current branch are a single shared current branch, the first branch node and the third branch node are a single shared branch node, and the first input transistor and the third input transistor are a single shared input transistor having a control terminal coupled to the inverting input terminal of the differential input stage and the input terminal of the compensation gain stage. In some embodiments, the inverting input terminal of the differential input stage is coupled to a third reference node through a first resistor, the input terminal of the compensation gain stage is coupled to the output terminal of the single-ended gain stage through a second resistor, and the first resistor and the second resistor form a resistive divider circuit. In further embodiments, the first reference node, the second reference node, and the third reference node are each coupled to a same reference voltage.

In various embodiments, the operational amplifier further includes an additional amplifier stage, where the output terminal of the differential input stage is coupled to the input terminal of the single-ended gain stage through the additional amplifier stage; and an additional compensation capacitor coupled between the output terminal of the single-ended gain stage and an input terminal of the additional amplifier stage. In some embodiments, the operational amplifier further includes an additional amplifier stage including an input terminal coupled to the output terminal of the single-ended gain stage and an output terminal; and an additional compensation capacitor coupled between the output terminal of the additional amplifier stage and the input terminal of the additional amplifier stage, where the input terminal of the compensation gain stage is coupled to the output terminal of the single-ended gain stage through the additional compensation capacitor.

According to various embodiments described herein, advantages may include multistage op-amps with positive gain in the frequency compensation path that leads to preventing the formation of a zero in the RHP, increased gain-bandwidth product, and reduced physical size, e.g., reduced silicon area, for the compensation capacitor.

The op-amps described herein can be used in a wide variety of applications. For example, the embodiments described herein can be used with memories, smart power technologies, display drivers, regulators/references, and in various automotive applications such as a motor driver, to name just a few. In one specific example, the embodiments described herein can be used as a driver in an embedded phase change memory.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An operational amplifier comprising:
a first amplifier stage coupled between an input node and a first intermediate node;
a second amplifier stage coupled between the first intermediate node and an output node;
a compensation capacitor having a first terminal coupled to the first intermediate node and a second terminal; and
a compensation amplifier coupled between the output node and the second terminal, the compensation amplifier having a positive gain greater than one.

2. The operational amplifier of claim 1, wherein the compensation amplifier comprises:
a current mirror coupled to the second terminal;
an input element coupled between the output node and the current mirror; and
a conduction element coupled to the second terminal, wherein the conduction element is coupled to the input element through the current mirror.

3. The operational amplifier of claim 2, wherein the current mirror comprises first and second transistors, the first and second transistors being sized according to a sizing ratio, wherein the sizing ratio is greater than one.

4. The operational amplifier of claim 2, wherein
the input element has a transconductance and the conduction element has a conductance, and
a ratio of the transconductance to the conductance is greater than one.

5. The operational amplifier of claim 1, further comprising a resistive divider circuit coupled between the input node and the output node.

6. The operational amplifier of claim 5, wherein the compensation amplifier comprises a first input coupled to the resistive divider circuit and a second input coupled to a first voltage node.

7. The operational amplifier of claim 1, wherein the compensation amplifier is directly connected to the output node.

8. The operational amplifier of claim 1, wherein
the first amplifier stage comprises a differential input, single-ended output amplifier; and
the second amplifier stage comprises a single-ended input, single-ended output amplifier.

9. The operational amplifier of claim 1, further comprising:
a third amplifier stage coupled between the first intermediate node and a second intermediate node, the second intermediate node coupled to an input of the second amplifier stage; and
an additional compensation capacitor coupled between the output node and the second intermediate node.

10. The operational amplifier of claim 1, further comprising:
a third amplifier stage coupled between a second intermediate node and the first intermediate node, the second intermediate node coupled to an output of the first amplifier stage; and
an additional compensation capacitor coupled between the output node and the second intermediate node.

11. The operational amplifier of claim 6, wherein the first voltage node is configured to receive a bandgap voltage.

12. The operational amplifier of claim 1, wherein the positive gain is greater than or equal to 2 and less than or equal to 25.

13. An operational amplifier comprising:
a differential input stage comprising a non-inverting input terminal, an inverting input terminal, and an output terminal;
a single-ended gain stage comprising an input terminal coupled to the output terminal of the differential input stage and an output terminal;
a compensation capacitor comprising a first terminal coupled to the input terminal of the single-ended gain stage and a second terminal; and
a compensation gain stage comprising an input terminal coupled to the output terminal of the single-ended gain stage and an output terminal coupled to the second terminal of the compensation capacitor, the compensation gain stage having a positive gain greater than one.

14. The operational amplifier of claim 13, wherein the compensation gain stage comprises:
a first current mirror comprising a first current branch between a supply rail and a first branch node and a second current branch between the supply rail and a second branch node, the second branch node being coupled to the second terminal of the compensation capacitor;
a diode connected transistor comprising a conduction path coupled from the second branch node to a reference node; and
a first input transistor comprising a conduction path coupled in series with the first current branch and a control terminal coupled to the input terminal of the compensation gain stage.

15. The operational amplifier of claim 14, wherein the differential input stage comprises the first input transistor.

16. The operational amplifier of claim 14, wherein:
the first current mirror comprises
a first current mirror transistor in series with the first input transistor, and
a second current mirror transistor in series with the diode connected transistor; and
the differential input stage comprises a second current mirror comprising
a third current mirror transistor in series with a second input transistor, and
a fourth current mirror transistor in series with a third input transistor.

17. The operational amplifier of claim 14, wherein the first current mirror comprises a first current mirror transistor and a second current mirror transistor, the first current mirror transistor and the second current mirror transistor being sized according to a sizing ratio, wherein the sizing ratio is greater than one.

18. The operational amplifier of claim 14, wherein the input terminal of the compensation gain stage is coupled to the output terminal of the single-ended gain stage through a resistive divider circuit.

19. The operational amplifier of claim 14, wherein the differential input stage comprises:
a second current mirror comprising a third current branch between a supply rail and a third branch node and a fourth current branch between the supply rail and a fourth branch node, the fourth branch node being coupled to the output terminal of the differential input stage;
a second input transistor comprising a conduction path coupled in series with the third current branch and a control terminal coupled to the inverting input terminal of the differential input stage; and a third input transistor comprising a conduction path coupled in series with the fourth current branch and a control terminal coupled to the non-inverting input terminal of the differential input stage.

20. The operational amplifier of claim 19, wherein the differential input stage further comprises a bias transistor comprising a conduction path coupled to the conduction path of the second input transistor and the conduction path of the third input transistor and a control terminal coupled to a bias voltage node.

21. The operational amplifier of claim 13, wherein the single-ended gain stage comprises:

an amplifying transistor comprising a conduction path coupled between a supply rail to the output terminal of the single-ended gain stage and a control terminal coupled to the input terminal of the single-ended gain stage; and a bias transistor comprising a conduction path coupled between the output terminal of the single-ended gain stage and a reference node and a control terminal coupled to a bias voltage node.

22. The operational amplifier of claim 13, further comprising a resistive divider circuit, wherein the compensation gain stage comprises a differential input, single-ended output amplifier comprising:

a non-inverting input terminal coupled to a bandgap voltage reference node, an inverting input terminal coupled to the input terminal of the compensation gain stage, and a single-ended output terminal coupled to the output terminal of the compensation gain stage, and the input terminal of the compensation gain stage is coupled to the output terminal of the single-ended gain stage through the resistive divider circuit.

23. The operational amplifier of claim 13, further comprising:

an additional amplifier stage, wherein the output terminal of the differential input stage is coupled to the input terminal of the single-ended gain stage via the additional amplifier stage; and an additional compensation capacitor coupled between the output terminal of the single-ended gain stage and an input terminal of the additional amplifier stage.

24. The operational amplifier of claim 13, further comprising:

an additional amplifier stage comprising an input terminal coupled to the output terminal of the single-ended gain stage and an output terminal; and an additional compensation capacitor coupled between the output terminal of the additional amplifier stage and the input terminal of the additional amplifier stage, wherein the input terminal of the compensation gain stage is coupled to the output terminal of the single-ended gain stage via the additional compensation capacitor.

25. An operational amplifier comprising:

a differential input stage comprising:

a first current mirror comprising a first current branch from a supply rail to a first branch node and a second current branch from the supply rail to a second branch node, the second branch node being coupled to an output terminal of the differential input stage, a first input transistor comprising a conduction path coupled in series with the first current branch and a control terminal coupled to an inverting input terminal of the differential input stage, and a second input transistor comprising a conduction path coupled in series with the second current branch and a control terminal coupled to a non-inverting input terminal of the differential input stage;

a single-ended gain stage comprising:

an amplifying transistor comprising a conduction path coupled from a supply rail to an output terminal of the single-ended gain stage and a control terminal coupled to an input terminal of the single-ended gain stage, wherein the input terminal of the single-ended gain stage is coupled to the output terminal of the differential input stage, and a bias transistor comprising a conduction path coupled from the output terminal of the single-ended gain stage to a first reference node and a control terminal coupled to a bias voltage node;

a compensation capacitor comprising a first terminal coupled to the input terminal of the single-ended gain stage and a second terminal; and a compensation gain stage having a positive gain greater than one, the compensation gain stage comprising:

a second current mirror comprising a third current branch from the supply rail to a third branch node and a fourth current branch from the supply rail to a fourth branch node, the fourth branch node being coupled to an output terminal of the compensation gain stage, wherein the output terminal of the compensation gain stage is coupled to the second terminal of the compensation capacitor, a diode connected transistor comprising a conduction path coupled from the fourth branch node to a second reference node, and a third input transistor comprising a conduction path coupled in series with the third current branch and a control terminal coupled to an input terminal of the compensation gain stage, wherein the input terminal of the compensation gain stage is coupled to the output terminal of the single-ended gain stage.

26. The operational amplifier of claim 25, wherein the first current mirror and the second current mirror comprise overlapping elements such that the first current branch and third current branch are a single shared current branch, the first branch node and the third branch node are a single shared branch node, and the first input transistor and the third input transistor are a single shared input transistor having a control terminal coupled to the inverting input terminal of the differential input stage and the input terminal of the compensation gain stage.

27. The operational amplifier of claim 26, wherein the inverting input terminal of the differential input stage is coupled to a third reference node through a first resistor, the input terminal of the compensation gain stage is coupled to the output terminal of the single-ended gain stage through a second resistor, and the first resistor and the second resistor form a resistive divider circuit.

28. The operational amplifier of claim 27, wherein the first reference node, the second reference node, and the third reference node are each coupled to a same reference voltage.

29. The operational amplifier of claim 25, further comprising:

an additional amplifier stage, wherein the output terminal of the differential input stage is coupled to the input terminal of the single-ended gain stage through the additional amplifier stage; and an additional compensation capacitor coupled between the output terminal of the single-ended gain stage and an input terminal of the additional amplifier stage.

30. The operational amplifier of claim 25, further comprising:

an additional amplifier stage comprising an input terminal coupled to the output terminal of the single-ended gain stage and an output terminal; and an additional compensation capacitor coupled between the output terminal of the additional amplifier stage and the input terminal of the additional amplifier stage, wherein the input terminal of the compensation gain stage is coupled to the output terminal of the single-ended gain stage through the additional compensation capacitor.

* * * * *